(12) United States Patent
Wang

(10) Patent No.: US 11,768,290 B2
(45) Date of Patent: Sep. 26, 2023

(54) LASER RANGE FINDER HAVING ADJUSTABLE BEAM SPLITTING OPTIC AND METHOD FOR ADJUSTING

(71) Applicant: SHENZHEN MAMMOTH ELECTRONIC CO., LTD, Shenzhen (CN)

(72) Inventor: Zhenxing Wang, Shenzhen (CN)

(73) Assignee: SHENZHEN MAMMOTH ELECTRONIC CO., LTD, Shenzhen (CN)

( * ) Notice: Subject to any disclaimer, the term of this patent is extended or adjusted under 35 U.S.C. 154(b) by 0 days.

(21) Appl. No.: 18/083,878

(22) Filed: Dec. 19, 2022

(65) Prior Publication Data

US 2023/0194708 A1 Jun. 22, 2023

Related U.S. Application Data

(63) Continuation of application No. PCT/CN2021/140033, filed on Dec. 21, 2021.

(51) Int. Cl.
*G01S 7/481* (2006.01)
*G01S 17/08* (2006.01)
(Continued)

(52) U.S. Cl.
CPC ............ *G01S 17/08* (2013.01); *G01S 7/4812* (2013.01); *G02B 7/003* (2013.01); *H02B 1/00* (2013.01);
(Continued)

(58) Field of Classification Search
CPC ....... G01C 13/00; G01C 13/02; G01S 7/4812; G01S 17/08; G01S 17/46; G01S 17/48;
(Continued)

(56) References Cited

U.S. PATENT DOCUMENTS

2012/0145785 A1\* 6/2012 Scrogin .................. F41G 3/065
235/404

FOREIGN PATENT DOCUMENTS

CN 101238389 A 8/2008
CN 105051568 A 11/2015
(Continued)

*Primary Examiner* — Ryan S Dunning
(74) *Attorney, Agent, or Firm* — Jeenam Park

(57) ABSTRACT

A laser range finder and method for adjusting, comprising a beam source, a photodetector, at least one beam shaping optic, an optic bracket, a circuit board, a beam splitting optic and a connecting device; the beam source comprises a first electro-optical component for emitting a laser beam, the photodetector comprises a second electro-optical component for receiving a received beam reflected and/or scattered by a target object along an optical axis, the beam shaping optic is configured to form a laser beam and/or a receiving beam, the optic bracket comprises a first accommodating seat for fixing the first electro-optical component and a second accommodating seat for fixing the at least one beam shaping optic, the circuit board comprises an another seat for fixing the second electro-optical component, the connecting device is configured to connect the optic bracket with the circuit board; the beam splitting optic is arranged on an adjustment bracket.

9 Claims, 3 Drawing Sheets

(51) Int. Cl.
 *G02B 7/00* (2021.01)
 *G02B 27/09* (2006.01)
 *G02B 27/10* (2006.01)
 *H02B 1/00* (2006.01)

(52) U.S. Cl.
 CPC ...... *G02B 27/0905* (2013.01); *G02B 27/1073* (2013.01); *H03K 2217/96023* (2013.01)

(58) Field of Classification Search
 CPC ........ G02B 7/003–005; G02B 27/0905; G02B 27/1073; H02B 1/00; H03K 2217/96023
 See application file for complete search history.

(56) References Cited

FOREIGN PATENT DOCUMENTS

| | | | |
|---|---|---|---|
| CN | 102798848 | A | 11/2017 |
| CN | 102809747 | A | 1/2018 |
| CN | 109387849 | A | 2/2019 |
| EP | 1351070 | A1 | 10/2003 |
| EP | 3839430 | A1 | 6/2021 |

* cited by examiner

LASER RANGE FINDER HAVING ADJUSTABLE BEAM SPLITTING OPTIC AND METHOD FOR ADJUSTING

CROSS-REFERENCE TO RELATED APPLICATIONS

This application is a continuation of co-pending International Patent Application No. PCT/CN2021/140033, filed on Dec. 21, 2021, the entire contents of which are incorporated herein by reference.

TECHNICAL FIELD

The present application relates to the technical field of laser measurement, in particular to a laser range finder with an emission optical axis and a receiving optical axis coaxial.

BACKGROUND

A laser range finder is a measuring device for a laser distance measuring system, comprising an electro-optical component constructed as a beam source, an additional electro-optical component constructed as a detector, a transmitting optic and a receiving optic. The beam source and the transmitting optic are referred to as the transmitting device; the detector and the receiving optic are referred to as the receiving device. The beam source emits a laser beam along an optical axis. The laser beam is concentrated by the transmitting optic and directed towards the target object. The received beam reflected and/or scattered by the target object is shaped by the receiving optic and directed towards the detector along an optical axis. The measuring devices are divided into a paraxial configuration, in which the optical axes of the transmitting and receiving devices extend parallel and offset, and a coaxial configuration, in which the optical axes of the transmitting and receiving devices overlap each other and are separated by means of a beam splitting optic. In the coaxial configuration, the transmitting optic and the receiving optic are integrated into a common beam shaping optic that shapes the laser beam and the receiving beam.

Chines patent, No. CN201210157986.4 discloses a measuring device for distance measurement, comprising an electro-optical component constructed as a beam source, another electro-optical component constructed as a detector, a beam shaping optic, a beam splitting optic, an optic bracket and a circuit board. The optic bracket is connected to the circuit board via a connecting device. The beam source is constructed as a laser diode, which generates a laser beam in the visible spectrum, for example a red laser beam with a wavelength of 635 nm or a green laser beam with a wavelength of 532 nm. The detector is constructed as a photodiode, the characteristics of which are matched to those of the laser diode. A control and analysis device is connected to the beam source and the detector and determines the distance to the target object from a time difference between the reference beam and the received beam acquired by the detector.

The beam shaping optic is constructed as lens that shapes both the emitted laser beam and the received beam. The laser beam is separated from the receiving beam extending coaxially therefrom by means of beam splitting optic. The beam splitting optic are arranged in the light path of the emitted laser beam between the beam source and the beam shaping optic and in the light path of reflected and/or scattered received beams between the beam shaping optic and the detector. The beam splitting optic is constructed as polarizing beam splitter, which mainly transmits light with the polarization direction of the emitted laser beam (transmission factor greater than about 80%) and partially reflects non-polarized light (reflection factor about 50%)). The beam reflected on the target object, i.e. the reflected part of the received beam, has a high intensity and has the same polarization direction as the emitted laser beam, whereas the beam scattered at the target object, i.e. the scattered part of the received beam is unpolarized. By means of the beam splitting optic, the part of the received beam that is reflected on the target object and thus polarized is strongly attenuated in order to prevent overshooting of the detector.

The circuit board is a carrier for electrical and electro-optical components and uses for mechanical fixing and electrical connection. The circuit board consists of an electrically insulating material with connected conductor tracks, for example fiber-reinforced plastic, PTFE, or ceramic. These components are brazed onto the brazing surface or in the weld eye and in this way are simultaneously mechanically held and electrically connected. Larger components can be fastened to the circuit board by means of gluing and screwing.

The beam source, beam shaping optic and beam splitting optic are arranged on the optic bracket. The optic bracket comprises a first accommodating seat for the first electro-optical component constructed as a beam source, a second accommodating seat for the beam shaping optic, and a third accommodating seat for the beam splitting optic. The second electro-optical component constructed as a detector is arranged in an another accommodating seat on the circuit board, wherein the circuit board serves as an another optic bracket for the second electro-optical component.

The optic bracket is constructed as an integral optic bracket, which is not composed of a plurality of parts but is composed of one material. The integral optic bracket has no connecting area between the first and second connecting objects. The optic bracket consists of a metallic material, such as zinc. The metallic optic bracket results in electrical shielding between the electro-optical components and reduces electrical crosstalk between the beam source and the detector. Zinc has high temperature stability, so that the temperature fluctuations to which laser distance measuring systems are often subjected have only a small effect on the adjustment state of the installed components and on the measuring properties of the measuring device. Furthermore, the zinc can be processed in a high-precision die-casting method, so that the accommodating seats could be manufactured very precisely and positioned relative to each other.

The detector is arranged on the front face of the circuit board facing the optic bracket and is fixedly connected to the circuit board via a solder connection, which can be assembled and soldered automatically during the production of the circuit board, for example. The detector is only connected to the circuit board and is held mechanically, there are no connectors that connect the detector directly to the optic bracket. The optic bracket is designed such that in the installed state the side facing the detector is open at least in the region of the detector and is connected with a first contact surface via a connecting device to a second contact surface provided on the front face of the circuit board. The connecting device is designed to be releasable at least during adjustment of the measuring device and adjustment of the detector.

The beam source emits a diverging primary laser beam along the optical axis. This primary laser beam hits a polarizing beam splitter, on which the largest possible part is transmitted and hits the beam shaping optic in the direction of the optical axis as a diverging secondary laser beam. The beam shaping optic concentrate the laser beam and direct the tertiary laser beam with a small divergence to the target object in the direction of the optical axis.

The received beam, hereafter referred to as the primary receiving beam, reflected and/or scattered by the target object hits the beam-shaping optic, which focuses the primary receiving beam and direct it as a secondary receiving beam to the beam splitting optic. The optical axis of the secondary received beam is coaxial with the optical axis of the secondary laser beam. The secondary received beam is at least partially reflected by the beam splitting optic and the reflected portion is directed along the optical axis to the detector as the tertiary received beam. The beam splitting optic is responsible for distinguishing the optical axis of the tertiary received beam from the optical axis of the primary laser beam.

The beam source and the beam shaping optic are designed to be adjustable in their accommodating seats at least during adjustment of the measuring device in a forward and/or backward direction extending parallel to the associated optical axis, wherein forward and/or backward direction is also known as the adjustment direction. The beam source and the beam shaping optic are only adjustable in the respective adjustment directions during adjustment of the measuring device, and adjustability in a plane direction perpendicular to the optical axis is not provided.

The adjustment of the measuring device is carried out by means of an optical instrument comprising a lens and a digital camera chip arranged in the focal plane of the lens. The optic is adjusted to the desired object distance, wherein the object distance can be adjusted to a finite distance of e.g. 10 in or to an infinite distance. The measuring device is arranged in front of the lens in such a way that the lens acquires images of the tertiary laser beam and the active area of the detector and images them on the camera chip. Both the laser beam and the image of the active area of the detector are simultaneously represented on the camera chip.

The adjustment of the measuring device is carried out in two steps: in a first step, the optical components in the optic bracket are adjusted along their respective adjustment directions, and in a second step, after the adjustment of the optic bracket, the detector is adjusted in a plane perpendicular to the associated optical axis. The first and second accommodating seats in the optic bracket are designed such that the electro-optical components and the beam shaping optic are adjustable only in their adjustment direction, adjustment in a plane perpendicular to the optical axis is not possible.

In a first step, the beam splitting optic is first placed in the third accommodating seat and fastened to the optic bracket. The connection can be designed to be releasable or non-releasable. The beam source and beam shaping optic are then placed into their accommodating seats. In order to adjust the beam shaping optic and the beam source, the circuit board with the detector is fitted with a stop to the optic bracket and is releasably connected to the optic bracket by means of a connecting device.

The beam shaping optic are moved in their adjustment direction until the optic adjusted to the desired object distance detect a sharp image of the active surface of the detector through the beam shaping optic, wherein the image is sharp at high contrast. In the case of maximum image sharpness, the beam shaping optic is adjusted to the desired distance with respect to the active surface of the detector, which corresponds to the object distance of the optic. The second accommodating seat for the beam-shaping optic is designed, for example, as a press-fit and the yearn-shaping optic are fixed by the clamping force of the press-fit; the movement of the beam-shaping optic in the adjustment direction overcomes the clamping of the press-fit under sufficient pressure. Alternatively or in addition to a press fit, the beam shaping optic can be connected to the optic bracket in a material-fit manner, for example by means of an adhesive connection.

Adjust the beam source after adjusting the beam shaping optic. The beam source emits a laser beam, which is monitored by means of the optical device. The beam source is moved in said direction until the optical instrument detects a minimum focal point of the laser beam by means of the beam shaping optic. In this case, the beam waist of the laser beam is located in the desired distance. The first accommodating seat for the beam source is constructed, for example, as a press fit and the beam source is fixed by the clamping force of the press fit; the displacement of the beam source in the adjustment direction is under sufficient pressure to overcome the clamping force of the press fit under the circumstances. Alternatively or in addition to a press fit, the beam source can be connected to the optic bracket in a material-fit manner, for example by means of an adhesive connection.

Adjust the detector after adjusting the optic bracket. Since the detector is non-releasably connected to the circuit board via a solder connection, the adjustment of the detector relative to the optic bracket takes place via the circuit board. For this purpose, the connecting device, which is designed to be releasable at least during adjustment of the measuring device, is released between the optic bracket and the circuit board. The beam source is switched on and emits a laser beam, which is acquired by the optic together with the image of the active of the detector. The laser beam forms a focal point on the camera chip and the active surface of the detector forms a sharp image, which is superimposed to the focal point of the laser beam. The circuit board is moved with the optic bracket in a stop manner in a plane oriented perpendicular to the optical axis of the tertiary received beam until the focal point of the laser beam is located on the camera chip in a defined area of the active surface of the detector. In this case, the position of the focal point of the laser beam corresponds to the position of a receiving beam focused on the photodiode, which is scattered by a target object arranged in the object distance of the optical device.

Then, connect the adjusted circuit board to the optic bracket. This persistent connection is achieved in two steps. In a first step, the circuit board is connected weakly to the optic bracket by means of an adhesive connection. In the second step, the circuit board is connected to the optic bracket via a screw connection. Alternatively, the circuit board can first be screwed under sufficient contact pressure and then additionally reinforced with glue.

When gluing, forces are transferred planarly from one to the other connecting objects. Glue connections do not require changing the connection object and in many cases can be reversed without harming the connection object. But the adhesive connection can change under the influence of temperature. Embrittlement of the adhesive bond may result at low temperatures and softening of the bond connection at high temperatures. In a threaded connection, stress concentrations are created on the connected objects, while the spaces in between hardly transmit force. Advantageously, the threaded connection is only subject to small temperature influences. Furthermore, the screw connection creates an electrical connection between the optic bracket and the circuit board.

The inventors found that, in the above technical solution, the adjustment of the measuring device is achieved in two steps: in the first step, the optical components in the optic bracket are adjusted along their respective adjustment directions, and after the adjustment of the optic bracket, in a second step, the detector is adjusted in a plane perpendicular to the associated optical axis. Wherein, the adjustment of the detector relative to the optic bracket is realized through the adjustment of the circuit board.

Since many electronic components are arranged on the circuit board, adjusting the circuit board may cause the electronic components to be unsoldered.

SUMMARY

The purpose of the present application is to provide a laser range finder, which can realize the fine adjustment of the measuring device by adjusting the beam splitting optic.

The technical solution adopted by the present application is: a laser range finder for measuring the distance between a reference mark and a target object (1); the laser range finder comprises a beam source and a photodetector (2), at least one beam shaping optic (3), an optic bracket (4), a circuit board (5), a beam splitting optic (6) and a connecting device (7); the beam source comprises a first electro-optical component (11) for emitting a laser beam along an optical axis, the photodetector comprising a second electro-optical component for receiving reflected and/or scattered reception by the target object along an optical axis, the beam shaping optic is configured to form a laser beam (12) and/or a receiving beam (13) along an optical axis, the optic bracket comprises a first accommodating seat (41) for fixing the first electro-optical component (11) and a second accommodating seat (42) for fixing the at least one beam shaping optic, the circuit board comprises an additional accommodating seat (51) for fixing the second electro-optical component, the connecting device is configured to connect the optic bracket with the circuit board;

It is characterized in that the beam splitting optic is arranged on an adjustment bracket (8), and the optic bracket comprises a third accommodating seat (45) for fixing the adjustment bracket; when adjusting the laser range finder, the first electro-optical component arranged in the optic bracket is adjustable relative to the optic bracket along the associated optical axis direction, and can be fixed at an adjusted position; further, the beam splitting optic arranged on the adjustment bracket is adjustable relative to the optic bracket and can be fixed in an adjusted position.

Further, the adjustment bracket comprises a pendulum structure (81), and the third receiving seat (45) is provided with a pendulum hole (451) matched with the pendulum structure, the beam splitting optic (6) is arranged on the pendulum structure; by adjusting the pendulum structure to swing slightly in the pendulum hole, the beam splitting optic arranged on the pendulum structure is also pivoted accordingly, thereby adjusting the direction of the associated optical axis of the beam splitting optic.

In particular, the pendulum structure (81) comprises a displacement plate (811) for fixing the beam splitting optic, and a spherical shell-shaped convex edge (812) matched with the pendulum hole (451), the spherical shell-shaped convex edge can swing slightly in the pendulum hole; the displacement plate is provided with at least three adjustment holes (813), each adjustment hole is provided with a matching adjustment screw (814) and threads; the third accommodating seat is provided with a mounting hole (452) matched with the adjusting hole, and the pendulum structure and the third accommodating seat are connected through the adjustment hole, the mounting hole and the matching adjustment screw and thread; by adjusting any adjustment screw, the position of the displacement plate can be adjusted slightly, so that the beam splitting optic on the displacement plate also swings accordingly, thereby adjusting the direction of the associated optical axis of the beam splitting optic.

Optionally, the second electro-optical component is arranged at a front position of the circuit board facing the optic bracket; when adjusting the laser range finder, the circuit board is adjustable relative to the optic brackets in a plane substantially perpendicular to the associated optical axis of the second electro-optical component.

Optionally, the second electro-optical component is arranged at a rear position of the circuit board facing away from the optic bracket; when adjusting the laser range finder, the second electro-optical component is adjustable relative to the circuit board in a plane substantially perpendicular to the associated optical axis of the second electro-optical component.

In particular, when adjusting the laser range finder, the beam shaping optic arranged in the optic bracket is adjustable relative to the optic bracket in a direction of the associated optical axis and can be fixed in an adjusted position.

In particular, the connecting device for connecting the first contact surface of the optic bracket with the second contact surface of the circuit board is configured as a screw connection.

In particular, the connecting device for connecting the first contact surface of the optic bracket with the second contact surface of the circuit board is constructed as adhesive and screw connections.

A method for adjusting a laser range finder, comprising the following steps:

Adjust the first electro-optical component (11) in the optic bracket (4) along an adjustment direction;

Fix the photodetector (2) on the circuit board (5);

Adjust an angle of the beam splitting optic by adjustment bracket (8) so that the laser beam (12) and the receiving beam (13) are coaxial.

Adjust the beam shaping optic (3) in the optic bracket (4) along the adjustment direction.

The beneficial effects of the present application are: the present application cleverly adjusts the beam splitting optic by adjusting the bracket, realizes the adjustment of the laser range finder, and overcomes the disadvantage of adjusting the laser range finder by adjusting the circuit board in the prior art.

DETAILED DESCRIPTION

Figure 1:
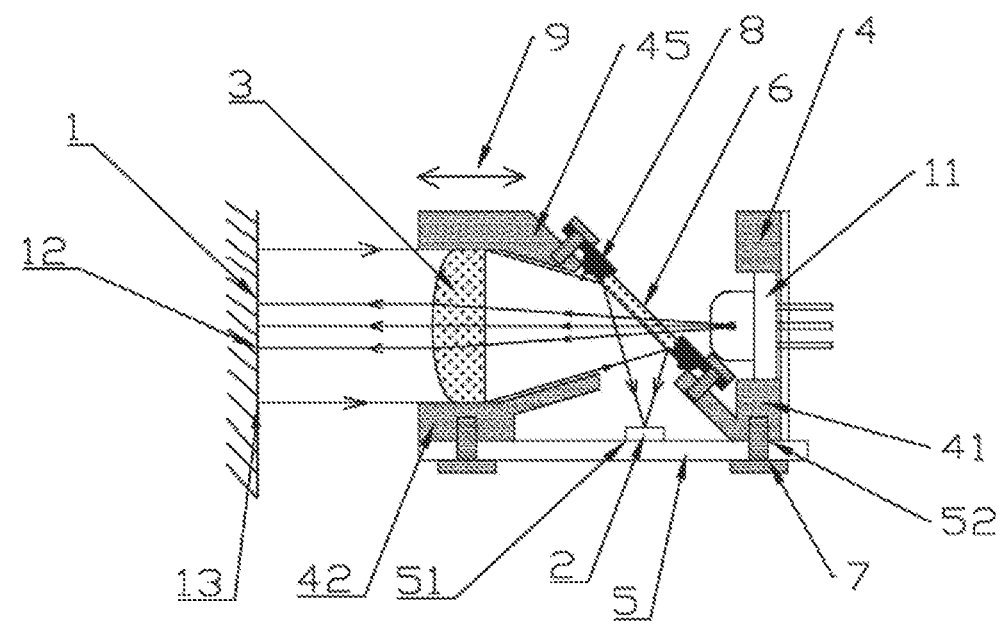
FIG. 1 is a schematic structural diagram of Embodiment 1 of the present application; Embodiment 1 is a coaxial laser range finder with a beam source, a photodetector and a beam splitting optic, and the beam source is arranged in the optic bracket, the photodetector is arranged at the front of the circuit board facing the optic bracket and is fixedly connected to the circuit board during adjustment of the laser range finder.

The technical solutions in the embodiments of the present application will be clearly and completely described below with reference to the accompanying drawings. Obviously, the described embodiments are only a part of the embodiments of the present application, but not all of the embodiments. Based on the embodiments of the present application, all other embodiments obtained by those of ordinary skill in the art without creative efforts shall fall within the protection scope of the present application.

The terms "first", "second" and "third" in the present application are only used for description purposes, and should not be understood as indicating or implying relative importance or implying the number of indicated technical features. Thus, a feature defined as "first", "second" and "third" may expressly or implicitly includes at least one of that features. In the description of the present application, "a plurality of" means at least two, such as two, three, etc., unless otherwise expressly and specifically defined. All directional indications (such as up, down, left, right, front, back, etc.) in the embodiments of the present application are only used to explain the relative positional relationship motion situation, etc. between various components under a certain posture (as shown in the accompanying drawings), if the specific posture changes, the directional indication also changes accordingly. Furthermore, the terms "comprising" and "including" and any variations thereof are intended to cover non-exclusive inclusion.

Reference herein to an "embodiment" means that a particular feature, structure, or characteristic described in connection with the embodiment can be included in at least one embodiment of the present application. The appearances of the phrase in various places in the specification are not necessarily all referring to the same embodiment, nor a separate or alternative embodiment that is mutually exclusive of other embodiments. It is explicitly and implicitly understood by those skilled in the art that the embodiments described herein may be combined with other embodiments.

Embodiment 1 shown in FIG. 1, FIG. 2, FIG. 3, FIG. 4, a laser range finder for measuring the distance between the reference mark and the target object (1); the laser range finder comprises a beam source, a photodetector (2), at least one beam shaping optic (3), an optic bracket (4), a circuit board (5), a beam splitting optic (6) and a connecting device (7); the beam source comprises a first electro-optical component (11) for emitting laser beam along an optical axis, the photodetector comprises a second electro-optical component for receiving a received beam reflected and/or scattered by the target object along an optical axis, the beam shaping optic is configured to form a laser beam (12) and/or a receiving beam (13) along an optical axis, the optic bracket comprises a first accommodating seat (41) for fixing the first electro-optical component (11) and a second accommodating seat (42) for fixing the at least one beam shaping optic, the circuit board comprises an additional accommodating seat (51) for fixing the second electro-optical component, the connection device is used to connect the first contact surface of the optic bracket with the second contact surface (52) of the circuit board;

The beam splitting optic is arranged on an adjustment bracket (8), and the optic bracket comprises a third accommodating seat (45) for fixing the adjustment bracket; when adjusting the laser range finder, the first electro-optical component arranged in the optic bracket is adjustable relative to the optic bracket along the associated optical axis direction, and can be fixed at an adjusted position; further, the beam splitting optic arranged on the adjustment bracket is adjustable relative to the optic bracket and can be fixed in an adjusted position.

The adjustment bracket comprises a pendulum structure (81), and the third receiving seat (45) is provided with a pendulum hole (451) matched with the pendulum structure, the beam splitting optic (6) is arranged on the pendulum structure; by adjusting the pendulum structure to swing slightly in the pendulum hole, the beam splitting optic arranged on the pendulum structure is also pivoted accordingly, thereby adjusting the direction of the associated optical axis of the beam splitting optic.

The pendulum structure (81) comprises a displacement plate (811) for fixing the beam splitting optic, and a spherical shell-shaped convex edge (812) matched with the pendulum hole (451), the spherical shell-shaped convex edge can swing slightly in the pendulum hole; the displacement plate is provided with at least three adjustment holes (813), each adjustment hole is provided with a matching adjustment screw (814) and threads; the third accommodating seat is provided with a mounting hole (452) matched with the adjusting hole, and the pendulum structure and the third accommodating seat are connected through the adjustment hole, the mounting hole and the matching adjustment screw and thread; by adjusting any adjustment screw, the position of the displacement plate can be adjusted slightly, so that the beam splitting optic on the displacement plate also swings accordingly, thereby adjusting the direction of the associated optical axis of the beam splitting optic.

The second electro-optical component is arranged at a front position of the circuit board facing the optic bracket, and is fixedly connected with the circuit board.

During adjustment of the laser range finder, the beam shaping optic arranged in the optic bracket are adjustable relative to the optic bracket in the direction of the associated optical axis and can be fixed in the adjusted position.

The connecting device for connecting the first contact surface of the optic bracket with the second contact surface (52) of the circuit board can be adhesive and screw connection.

During adjustment of the laser range finder, the beam source (or the first electro-optical component (11)) and the beam-shaping optic (3) are adjustable in a forward and/or backward direction extending parallel to the associated optical axis. Wherein the forward and/or backward directions are also referred to as adjustment directions.

The adjusting method of the laser range finder disclosed in Embodiment 1 is as follows:

Adjust the first electro-optical component (in the optic bracket (4)) along the adjustment direction;

Fix the photodetector (2) on the circuit board (5);

Adjust the angle of the beam splitting optic by adjusting the bracket (8) so that the laser beam (12) and the receiving beam (13) are coaxial.

Adjust the beam shaping optic (3) in the optic bracket (4) along the adjustment direction.

Figure 2:
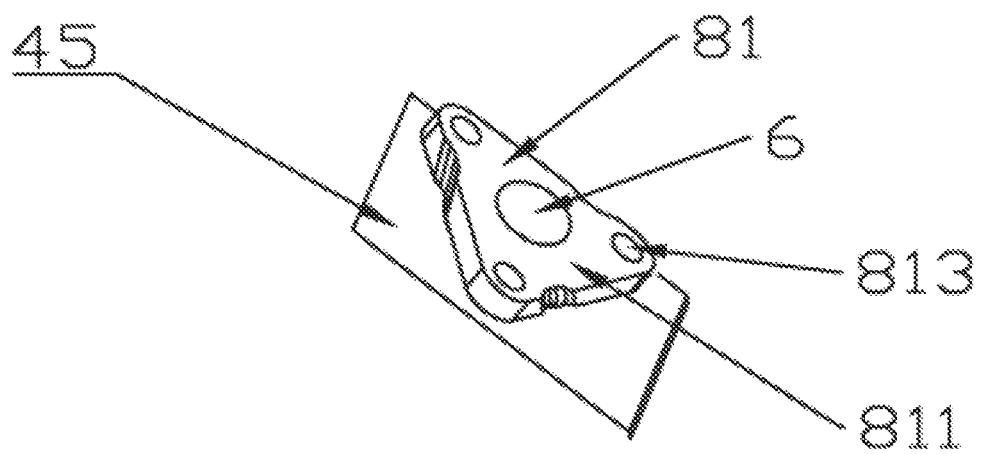
FIG. 2 is the three-dimensional structure schematic diagram of the adjustment bracket of the present application.
Figure 3:
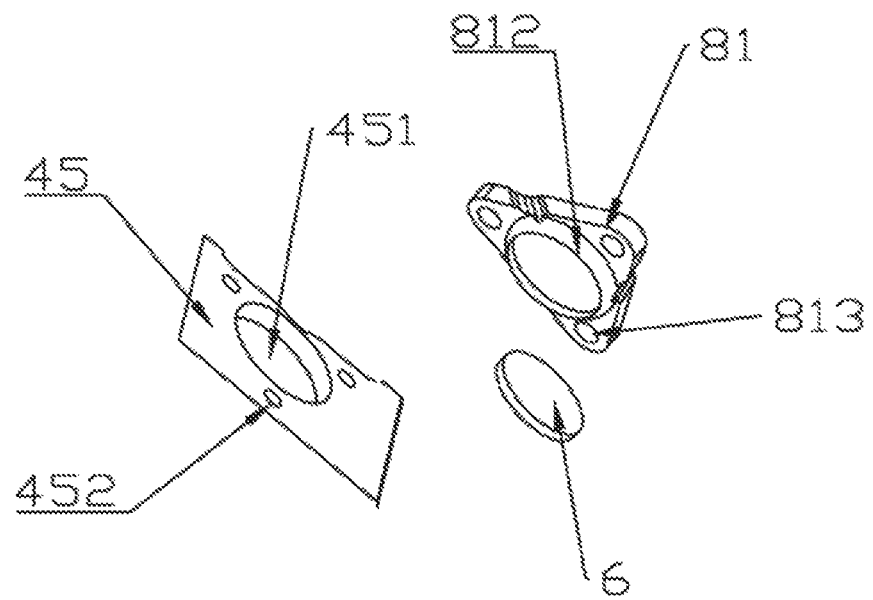
FIG. 3 is the exploded schematic diagram of the adjustment bracket of the present application.
Figure 4:
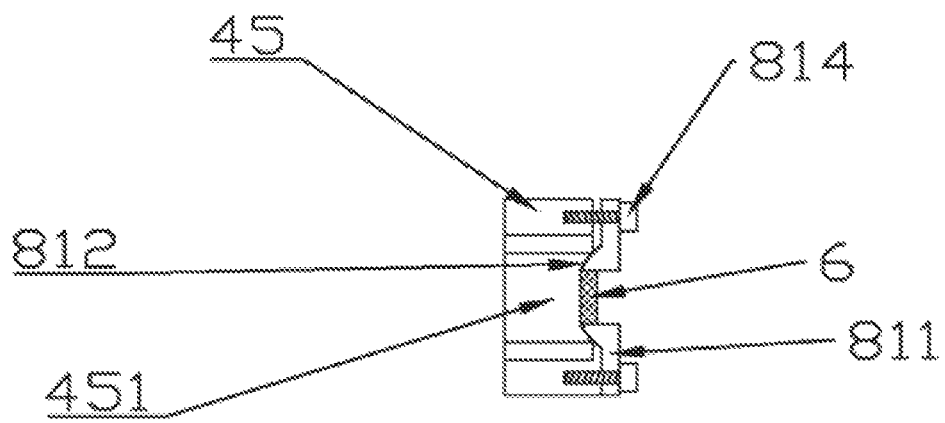
FIG. 4 is a schematic cross-sectional structural diagram of an adjustment bracket of the present application.
Figure 5:
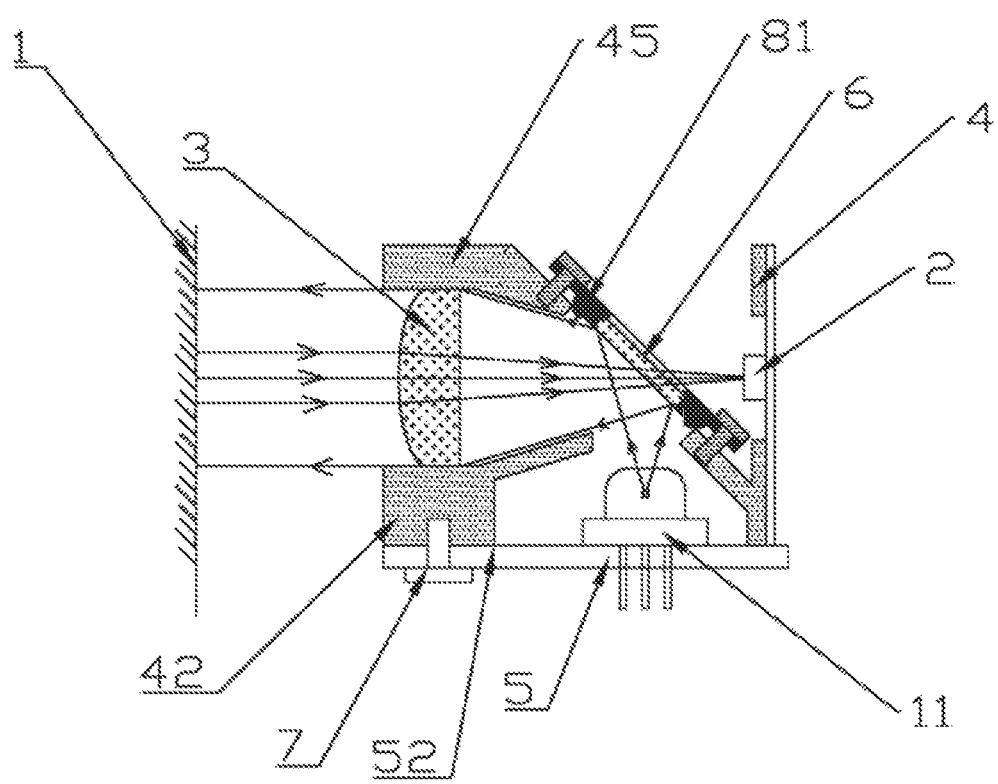
FIG. 5 is the embodiment 2 of the coaxial laser range finder with a beam source, a photodetector and a beam splitting optic, the beam source is arranged in the optic bracket, and the photodetector is arranged in the rear position of the circuit board facing away from the optic bracket and is adjustable relative to the circuit board during adjustment of the laser range finder.

As shown in FIG. 1, FIG. 2, FIG. 3. FIG. 5, Embodiment 2 differs from Embodiment 1 in that the configuration of the beam source (or the first electro-optical component (11)) and the photodetector (2) (or the first electro-optical component (11)). In contras to Embodiment 1, the beam source is arranged on the circuit board and the photodetector is arranged in the optic bracket.

Embodiment 2 comprises an optic bracket and a circuit board 5. The optic bracket is provided with a detector 2 including a first electro-optical component, a beam shaping optic 3 and a beam splitting optic 6, A Beam source 11 is arranged on the circuit board as a second electro-optical component. The circuit board 5 is detachably connected to the optic bracket 4 via the connecting device 7 at least during adjustment of the laser range finder 21.

The adjusting method of embodiment 2 is as follows:

Adjust the first electro-optical component (11) in the optic bracket (4) along the adjustment direction;

Fix the photodetector (2) on the circuit board (5);

Adjust the angle of the beam splitting optic by adjusting the bracket (8) so that the laser beam and the receiving beam are coaxial.

Adjust the beam shaping optic (3) in the optic bracket (4) along the adjustment direction.

The above descriptions are only preferred embodiments of the present application and are not intended to limit the present application. Any modifications, equivalent replacements and improvements made within the spirit and principles of the present application shall be included within the protection range of the present application.

What is claimed is:

1. A laser range finder for measuring a distance between a reference mark and a target object (1); the laser range finder comprises a beam source, a photodetector (2), and at least one beam shaping optic (3), an optic bracket (4), a circuit board (5), a beam splitting optic (6) and a connecting device (7); the beam source comprises a first electro-optical component (11) for emitting laser beam along an optical axis, the photodetector comprises a second electro-optical component for receiving a received beam reflected and/or scattered by the target object along an optical axis, the beam shaping optic is configured to form a laser beam (12) and/or a receiving beam (13) along an optical axis, the optic bracket comprises a first accommodating seat (41) for fixing the first electro-optical component (11) and a second accommodating seat (42) for fixing the at least one beam shaping optic, the circuit board comprises an additional accommodating seat (51) for fixing the second electro-optical component, the connecting device is configured to connect the optic bracket with the circuit board;

wherein the beam splitting optic is arranged on an adjustment bracket (8), and the optic bracket comprises a third accommodating seat (45) for fixing the adjustment bracket; when adjusting the laser range finder, the first electro-optical component arranged in the optic bracket is adjustable relative to the optic bracket along the associated optical axis direction, and can be fixed at an adjusted position; further, the beam splitting optic arranged on the adjustment bracket is adjustable relative to the optic bracket and can be fixed in an adjusted position.

2. The laser range finder according to claim 1, wherein the second electro-optical component is arranged at a front position of the circuit board facing the optic bracket; when adjusting the laser range finder, the circuit board is adjustable relative to the optic brackets in a plane substantially perpendicular to the associated optical axis of the second electro-optical component.

3. The laser range finder according to claim 1, wherein the second electro-optical component is arranged at a rear position of the circuit board facing away from the optic bracket; when adjusting the laser range finder, the second electro-optical component is adjustable relative to the circuit board in a plane substantially perpendicular to the associated optical axis of the second electro-optical component.

4. The laser range finder according to claim 1, wherein when adjusting the laser range finder, the beam shaping optic arranged in the optic bracket is adjustable relative to the optic bracket in a direction of the associated optical axis and can be fixed in an adjusted position.

5. The laser range finder according to claim 1, wherein the connecting device connecting the optic bracket and the circuit board is a screw connection.

6. The laser range finder according to claim 1, wherein the adjustment bracket comprises a pendulum structure (81), and the third receiving seat (45) is provided with a pendulum hole (451) matched with the pendulum structure, the beam splitting optic (6) is arranged on the pendulum structure; by adjusting the pendulum structure to swing slightly in the pendulum hole, the beam splitting optic arranged on the pendulum structure is also pivoted accordingly, thereby adjusting the direction of the associated optical axis of the beam splitting optic.

7. The laser range finder according to claim 6, characterized in that the pendulum structure (81) comprises a displacement plate (811) for fixing the beam splitting optic, and a spherical shell-shaped convex edge (812) matched with the pendulum hole (451), the spherical shell-shaped convex edge can swing slightly in the pendulum hole; the displacement plate is provided with at least three adjustment holes (813), each adjustment hole is provided with a matching adjustment screw (814) and threads; the third accommodating seat is provided with a mounting hole (452) matched with the adjusting hole, and the pendulum structure and the third accommodating seat are connected through the adjustment hole, the mounting hole and the matching adjustment screw and thread; by adjusting any adjustment screw, the position of the displacement plate can be adjusted slightly, so that the beam splitting optic on the displacement plate also swings accordingly, thereby adjusting the direction of the associated optical axis of the beam splitting optic.

8. A method for adjusting a laser range finder according claim 1, comprising the steps of:

adjust the first electro-optical component (11) in the optic bracket (4) along an adjustment direction;

fix the photodetector (2) on the circuit board (5);

adjust an angle of the beam splitting optic by adjustment bracket (8) so that the laser beam (12) and the receiving beam (13) are coaxial.

9. The method for adjusting a laser range finder according to claim 8, comprising the step of: adjust the beam shaping optic (3) in the optic bracket (4) along the adjustment direction.

* * * * *